(12) United States Patent
Clement et al.

(10) Patent No.: US 6,356,594 B1
(45) Date of Patent: Mar. 12, 2002

(54) DATA CONVERTER

(75) Inventors: Patrick Clement, Bussigny (CH); Nadim Khlat, Cugnaux (FR)

(73) Assignee: Motorola, Inc., Svhaumburg, IL (US)

( * ) Notice: Subject to any disclaimer, the term of this patent is extended or adjusted under 35 U.S.C. 154(b) by 0 days.

(21) Appl. No.: 09/431,482

(22) Filed: Nov. 2, 1999

(30) Foreign Application Priority Data

Nov. 3, 1998 (EP) .............................. 98402737

(51) Int. Cl.$^7$ .............................. H04L 23/02; H04L 5/12
(52) U.S. Cl. ..................... 375/261; 375/298; 375/320; 375/269
(58) Field of Search .................. 375/295, 298, 375/302, 303, 308, 269, 271, 272, 279, 261, 316, 320, 268

(56) References Cited

U.S. PATENT DOCUMENTS

| | | | | |
|---|---|---|---|---|
| 4,015,222 A | * | 3/1977 | Werner | 332/103 |
| 5,719,867 A | * | 2/1998 | Borazjani | 370/436 |
| 5,757,862 A | | 5/1998 | Ishizu | 375/324 |
| 5,825,829 A | * | 10/1998 | Borazjani et al. | 375/308 |
| 5,838,797 A | * | 11/1998 | Iwasaki | 380/49 |

FOREIGN PATENT DOCUMENTS

| | | | |
|---|---|---|---|
| EP | 0451966 A2 | 10/1991 | G10K/11/34 |
| EP | 0658007 A1 | 6/1995 | H03M/3/02 |
| WO | WO9720657 | 6/1997 | B23Q/15/00 |

* cited by examiner

*Primary Examiner*—Chi Pham
*Assistant Examiner*—Phuong Phu

(57) ABSTRACT

An analogue to digital or digital to analogue data converter 1 for converting between a first digital signal 101,102 at a first sampling rate $f_o$ and a first analogue signal 171,172, comprises a first conversion stage 11,12,21,22,31,32 for converting an input signal 101,102 into an intermediate digital signal 131,132 at a second sampling rate $f_{sm}$ which is greater than the first over-sampling rate $f_o$; a processing stage 30,41,42,43,44,51,52 for performing digital signal processing on the intermediate digital signal to generate a processed intermediate digital signal 151,152; and a second conversion stage 61,62,71,72 for converting the processed intermediate digital signal into an output signal 171,172, wherein the input and output signals comprise the first analogue signal and the first digital signal or vice versa depending on whether the data converter is performing analogue to digital or digital to analogue conversion.

13 Claims, 6 Drawing Sheets

A=100−67.7=32.3KHz (AFTER DOWN CONVERSION BY −100:−67.7KHz
THE FCBw IS INSIDE THE DIGITAL SELECTIVITY FILTER)

B=100−67.7+54=86.3KHz (AFTER DOWN CONVERSION BY −100:−13.7KHz
THE FCBw IS INSIDE THE DIGITAL SELECTIVITY FILTER)

C=100−67.7−54=21.7KHz (AFTER DOWN CONVERSION BY −100:−1217KHz
THE FCBw IS INSIDE THE DIGITAL SELECTIVITY FILTER)
(AFTER DOWN CONVERSION BY +100:+78.3KHz, THE TCBw IS INSIDE
THE DIGITAL SELECTIVITY FILTER)

DATA CONVERTER

FIELD OF THE INVENTION

The present invention relates to a data converter and in particular to a data converter for use in a receiver or transmitter.

BACKGROUND OF THE INVENTION

In many devices such as portable communication devices, especially those which use a digital modulation scheme, there is often a need to convert radio or other modulated signals received by the device from analogue to digital, and to convert signals to be transmitted by the device from digital to analogue.

Sigma-delta and delta-sigma converters are frequently used for this purpose for a number of well known reasons, such as good linearity, suitability for formation on an integrated circuit, etc. However, in order for such converters to be suitable for this purpose, especially for use in sophisticated portable communication devices, they generally need to be quite complex. Typically, such converters will include a number of different stages, with different levels of over-sampling at the different stages. Furthermore, complicated filtering is required at each stage to remove noise that has been generated by the converter. Typically this is achieved by providing a filter at the output of each stage which filters out at least all components whose frequency is greater than about half the clock frequency used at each stage.

Additionally, a device such as a portable communications device will need to perform digital signal processing on the signal after Analogue to Digital (A to D) conversion in the case of received signals, or prior to D to A conversion in the case of signals to be transmitted. Such signal processing will typically include some sort of phase function transformation, such as conversion between an Intermediate Frequency (IF) and base-band, and also digital filtering.

Furthermore, a conventional superheterodyne transceiver suffers from the drawback of only being able to receive or transmit within a single radio channel having a given channel bandwidth (e.g. 200 kHz in GSM), for a single setting of the main local oscillator. In order to change to a different channel, the main local oscillator needs to be reprogrammed to a new frequency. This requires a certain finite time, commonly referred to as the settling time, before the new frequency is correctly established. A settling time of 100–400 $\mu$s is typical. This may be worse in some cases when, for example, it is necessary to adjust the dc offset of the transceiver when operating in the new channel.

BRIEF DESCRIPTION OF THE FIGURES

In order that the present invention may be better understood, embodiments thereof will now be described by way of example only with reference to the accompanying drawings in which.

DETAILED DESCRIPTION OF THE FIGURES

Figure 1:
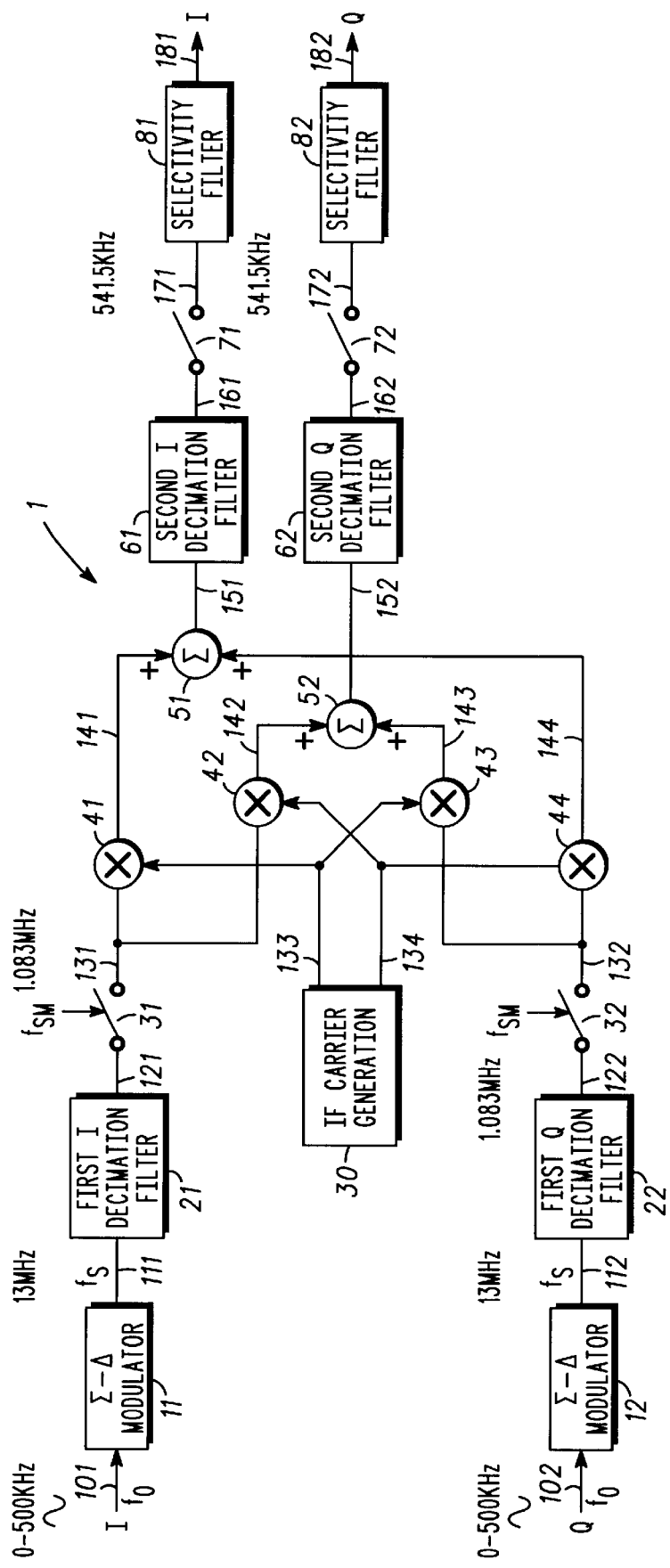
FIG. 1 is a block diagram of an analogue to digital data converter.

According to a first aspect of the present invention, there is provided a complex data converter for converting between a first digital signal at a first over-sampling rate and a first analogue signal, the complex data converter comprising a first conversion stage for converting a quadrature pair of input signals into intermediate digital signals at a second over-sampling rate which is greater than the first over-sampling rate; a processing stage for performing digital signal processing on the intermediate digital signals to generate processed intermediate digital signals; and a second conversion stage for converting the processed intermediate digital signals into a quadrature pair of output signals, wherein the quadrature input and output signals comprise the first analogue signal and the first digital signal or vice versa depending on whether the complex data converter is performing analogue to digital or digital to analogue conversion.

It will thus be apparent to a person skilled in the art, that the present invention enables signal processing, which is not directly related to data conversion, to be performed within the data converter. This gives rise to a number of advantages over conventional data converters. For example, some digital signal processing can be performed more efficiently if the signal is at an over-sampling rate greater than approximately unity. As a result, some signal processing can be performed more efficiently on the intermediate digital signal within the data converter according to the present invention than on the first digital signal outside the data converter because the intermediate digital signal is at a greater over-sampling rate than the first digital signal. Note that the first digital signal is normally at an over-sampling rate close to unity. The term "over-sampling rate" will be understood by a person skilled in the art to refer to the ratio of the actual sampling rate of a signal to the Nyquist rate of the wanted part of the signal at base-band, this being twice the maximum bandwidth of the wanted signal (e.g. about 220 kHz in GSM where the maximum bandwidth of a signal is about 110 Hz, the channel width between adjacent channels being about 200 kHz).

Another advantage which the present invention gives rise to is that the total amount of digital filtering required by a device can be reduced by enabling a filtering stage within the converter to perform at least some of the filtering for a filtering stage outside the converter or vice versa.

According to a preferred embodiment of the present invention, the digital processing stage includes digital mixing means for performing phase function transformations, such as a frequency transformation. The term phase-function transformation is used here to describe an operation such as:

$$X(t)=e^{i(\omega t+\phi(t))} \rightarrow X'(t)=X(t) \cdot e^{i\Phi(t)}=e^{i(\omega t+\phi(t)+\Phi(t))}$$

where $X(t)$ is the intermediate digital signal represented as a phase modulated signal, the phase modulation being given by $\phi(t)$, and $\Phi(t)$ is the phase function by which the intermediate signal is being transformed. Clearly, if $$\frac{d\Phi(t)}{dt}=\omega_1$$

where $\omega_1$ is constant in time, $\Phi(t)=\omega_1 t$ and the operation comprises performing a frequency shift on the intermediate digital signal given by $f_1=\omega_1/2\pi$.

Preferably, the data converter is a band-pass converter for receiving an Intermediate Frequency (IF) signal and outputting a base-band signal or vice versa. The term "IF signal" is here used to mean both an IF signal in the conventional sense of a single frequency IF carrier signal modulated by the wanted signal and an alternative and advantageous case in which the IF carrier signal is not a single frequency but has a spread spectrum as a result of it having been modulated by a spread spectrum phase function, the spread carrier signal then being modulated by the wanted signal as before.

According to a second aspect of the present invention, there is provided a method of converting data between a first digital signal at a first over-sampling rate and a first analogue signal, the method comprising the steps of converting a quadrature pair of input signals into intermediate digital signals at a second over-sampling rate which is greater than the first over-sampling rate; performing digital signal processing on the intermediate digital signals to generate processed intermediate digital signals; and converting the processed intermediate digital signals into a quadrature pair of output signals, wherein the quadrature input and output signals comprise the first analogue signal and the first digital signal or vice versa depending on whether the data is being converted from analogue to digital or digital to analogue.

In a preferred embodiment, the complex multiplication means includes inversion means for selectively inverting one or more of the intermediate digital signals and/or the processed intermediate digital signals. With such a multiplication means, it is possible for a receiver having a local oscillator to tune itself to detect a first channel corresponding to a first setting of the local oscillator, and then to detect, at least to some extent, signals located outside the first channel simply by selectively inverting one or more of the components of the complex IF and/or base-band signals, without having to change the setting of the local oscillator.

Referring firstly to FIG. 1, analogue to digital data converter 1 comprises an I 11 and a Q 12 Sigma-Delta modulator, a first I decimation filter 21 and a first Q decimation filter 22, a first I decimator 31 and a first Q decimator 32, an IF carrier phase signal generator 30, first, second, third and fourth mixers 41,42,43,44, first and second adder/subtractors 51,52, a second I decimation filter 61 and a second Q decimation filter 62, second I and Q decimators 71,72 and I and Q selectivity filters 81,82. A complex analogue IF signal, which comprises an in-phase (I) component 101 and a quadrature phase (Q) component 102, is input to the data converter 1, the I component being input to the I sigma-delta modulator 11 and the Q component being input to the Q sigma-delta modulator 12. The I and Q sigma-delta modulators 11 and 12 generate very noisy, high rate digital signals 111 and 112 respectively. In the embodiment shown in FIG. 1, the noisy digital signals 111,112 are output from the modulators 11,12 at a clock or sample rate, $f_s$, of approximately 13 MHz. These signals are input to the first I and Q decimation filters 21, 22 which remove the majority of the high frequency noise (generated by the modulators 11,12) to generate filtered high frequency I and Q signals 121,131 which are then decimated by decimators 31,32 to produce intermediate digital I and Q signals 131, 132 at a sampling rate $f_s$ of, in this example, approximately 1.083 MHz.

The I intermediate digital signal 131 is input to the first and second mixers 41,42. The Q intermediate digital signal 132 is input to the third and fourth mixers 43,44. Additionally, the IF carrier phase signal generator generates at least a first 133 and a second 134 IF phase function signal, the first signal 133 being input to the first and third mixers 41,43 and the second signal 134 being input to the second and fourth mixers 42,44. First mixer 41 mixes signal 131 with signal 133 to generate signal 141 which is input to the first adder/subtractor 51. Second mixer 42 mixes signal 131 with signal 134 to generate a signal 142 which is input to the second adder/subtractor 52. The third mixer 43 mixes signal 132 with signal 133 to generate a signal 143 which is fed to a second input of the adder/subtractor 52. Fourth mixer 44 mixes signal 132 with signal 134 to generate a signal 144 which is fed to a second inverting input of the first adder/subtractor 51.

The first adder/subtractor 51 subtracts signal 144 from signal 141 to generate a processed intermediate digital I signal 151 which is input to the second I decimation filter 61. The second adder/subtractor 52 adds signal 142 to signal 143 to generate a processed intermediate digital Q signal 152 which is input to the second Q decimation filter 62. The second decimation filters 61,62 again remove high frequency noise (the general object of decimation filters is to remove all noise at frequencies greater than half the sampling frequency of the decimator immediately following the decimation filter—however, in this case, the requirements of the decimation filter may advantageously be relaxed somewhat. The reason for this is that although any noise at a frequency greater than half the frequency of the decimator will appear as noise, after decimation, at a frequency given by half the frequency of the decimator minus the difference between half the frequency of the decimator and the frequency of the unfiltered noise, because a certain amount of noise having a frequency above the maximum frequency of the wanted signal may be permitted because of the action of selectivity filters later on in the circuit will remove such noise anyway it need not also be removed by the decimation filter). The output signals 161,162 of the second decimation filters 61,62 are decimated by the second decimators 71,72 to an output sampling rate $f_o$ in this case of approximately 541.5 kHz which corresponds to an oversampling rate of 2 for GSM. Alternatively, the second decimation filters and decimators could be arranged to output signals at an oversampling rate of 1 at this stage. The outputs of the decimators are unfiltered output I and Q signals 171,172 which are input to the I and Q selectivity filters 81,82 which remove any noise outside the bandwidth of the wanted signal caused for example either by noise generated by the data converter stages or by adjacent signals. The selectivity filters output filtered output I and Q signals 181,182 respectively which may then be further processed or converted into a simple data stream, etc.

A person skilled in the art will recognise that the IF carrier phase signal generator 30 together with the mixers 41,42, 43,44 and adder/subtractors 51,52 are arranged as a complex multiplier arrangement to perform non-data conversion signal processing of the phase function transfer type such as $$X(t)=e^{i(\omega t+\phi t)} \to X'(t)=X(t) \cdot e^{i\Phi(t)}=e^{i(\omega t+\phi(t)+\Phi(t))}$$

where X(t) is the intermediate digital signal 131,132 represented as a phase modulated signal, the phase modulation being given by $\phi(t)$, and $\Phi(t)$ is the phase function by which the intermediate signal is being transformed and the first and second signals 133,134 generated by the IF carrier phase signal generator are mathematically represented by $e^{i\Phi(t)}$. Clearly, if $$\frac{d\Phi(t)}{dt} = \omega_1$$

where $\omega_1$, is constant in time, $\Phi(t)=\omega_1 t$ and the operation comprises performing a frequency shift on the intermediate digital signal given by $f_1=\omega_1/2\pi$. Alternatively, $\Phi(t)$ might not be constant in time in which case it would correspond to a despreading operation (for details of which see copending European patent application No. 98401954.7).

In a preferred embodiment, the data converter includes a dc notch filter located immediately prior to the mixers 41,42,43,44 for removing any unwanted dc components from the intermediate digital signal 131,132 caused, for example, by leakage from the local rf oscillator (not shown in FIG. 1) or non-linearities in the circuit elements up to the mixers 41,42,43,44. This is preferable to the use of an IF notch filter for removing the unwanted dc components after they have been converted to an IF frequency by the signal processing section 30,41,42,43,44,51,52 because such a filter would generally also remove wanted components whose frequency was the inverted frequency of the unwanted components (e.g. if the unwanted components were transformed from dc to 100 kHz, a 100 kHz notch filter would also remove components at −100 kHz) unless a sophisticated complex filter was used, which is not necessary if a dc notch filter is used instead.

Figure 2:
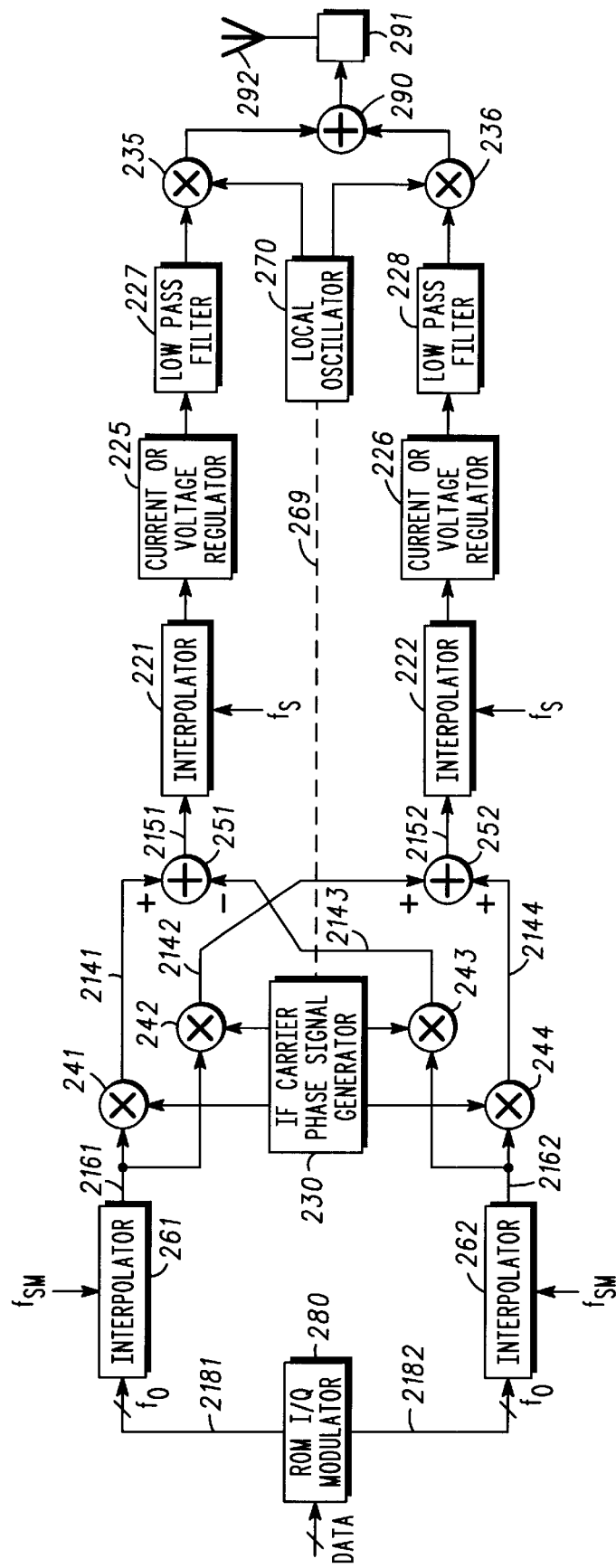
FIG. 2 is a block diagram of a digital to analogue data converter together with an associated I/Q modulator and rf transmission circuitry.

Referring now to FIG. 2, there is shown a digital to analogue data converter together with a ROM IQ modulator 280, complex IF to non-complex rf conversion circuitry 270,235,236,290, rf amplification and processing means 291 and aerial 292. The rest of the data converter is essentially similar to data converter 1 except that it is arranged as a digital to analogue data converter and thus elements such as the decimation filters and decimators 21,22,31,32,61,62,71, 72 have been replaced with the corresponding interpolators 261,262,221,222, and the sigma-delta modulators 11,12 have been replaced with current or voltage converters 225, 226 and low pass filters 227,228. Furthermore, the complex multiplier arrangement 230,241,242,243,244,251,252 is represented in a slightly different manner for reasons of convention (note the construction of a complex multiplier is well within the capabilities of a person skilled in the art and will not be described here in greater detail—further details may however, be obtained from copending European patent application No. 98401954.7).

The operation of the data converter of FIG. 2 is essentially analagous to that of FIG. 1, thus a data stream to be transmitted is input to the ROM IQ modulator 280 which generates a complex baseband signal therefrom comprising an I baseband signal 2181 and a Q baseband signal 2182 at a sampling rate $f_o$ of, for example, approximately 271 kHz, or in GSM, an oversampling rate of 1. At this stage, the signals may each be 10 bits wide for example. These signals are then input to the first interpolators 261,262 which generate intermediate digital signals 2161,2162 which are at a greater sampling rate $f_{sm}$, for example of 1.083 MHz but will probably be fewer bits wide (for example 8 bits wide).

The intermediate digital signals 2161,2162 are fed into the complex multiplier arrangement 241,242,243,244,251, 252 which performs a phase function transformation on the complex intermediate digital signal 2161,2162 given by the complex signal generated by the IF carrier phase signal generator 230 which will for example be of the form $e^{i(\Phi(t))}$ where $\Phi(t)$ represents the phase function by which the complex intermediate digital signal 2161,2162 is being transformed. The effect of this is typically to convert the baseband signal to a complex IF signal 2151,2152 which is output from the complex multiplier arrangement 241,242, 243,244,251,252. The complex IF signal comprises an I processed intermediate digital signal 2151 and a Q processed intermediate digital signal 2152. These signals are input to second interpolators 221,222 which generate interpolated digital signals at a much higher sampling rate $f_s$ of for example 13 MHz but much less wide—it might for example be only 1 or 2 bits wide. The output signals from the second interpolators 221,222 are then fed into the current or voltage converters which generate for example, different voltage values for different input signals; the very quickly varying output current or voltage signals are then filtered through a low pass filter to generate smooth analogue signals corresponding to the processed intermediate digital signals 2151,2152 which thus correspond to a complex analogue IF signal. This analogue IF signal is then upconverted and transmitted using elements 270,235,236,290,291,292 in well known manner. Note, however, that dotted line 269 indicates the possibility of a communication channel between the IF carrier phase signal generator and the local rf oscillator which would permit a spreading/despreading manipulation of the signal to be transmitted at the complex multiplier/upconversion arrangements.

Figure 3:
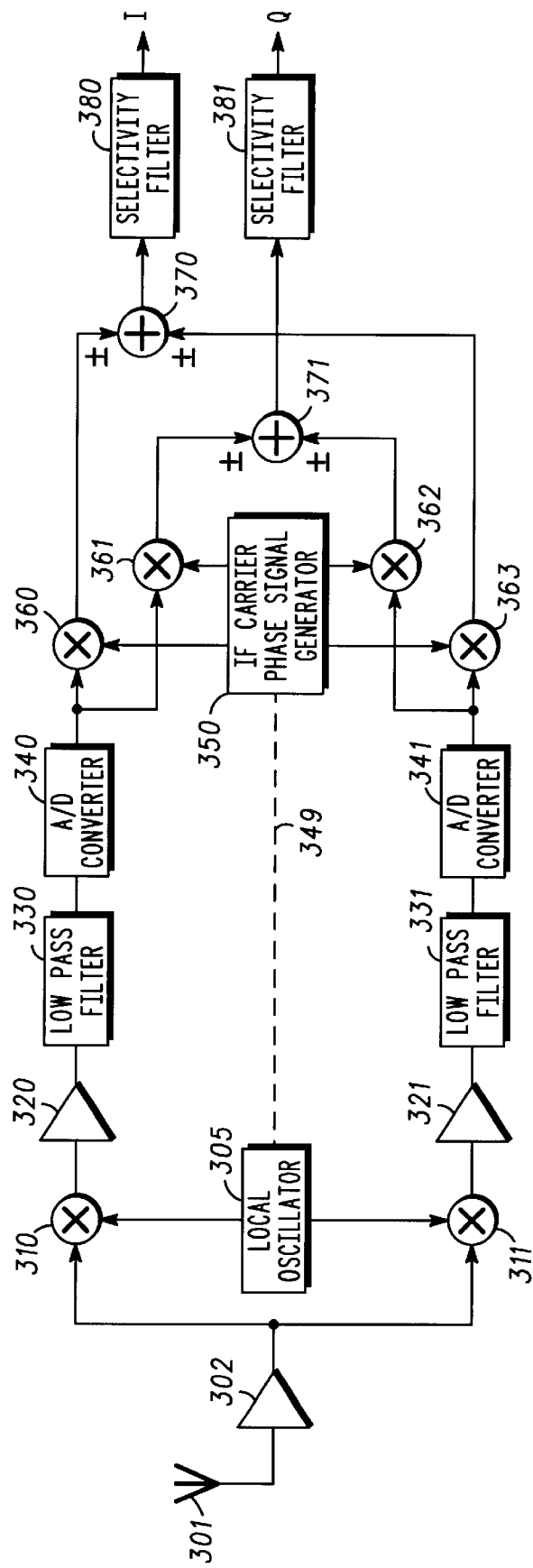
FIG. 3 is a block diagram of radio receiver circuitry.

FIG. 3 shows a radio receiver arrangement comprising an aerial 301, rf amplification means and associated circuitry 302, first and second rf mixers 310,311, local rf oscillator 305, I and Q IF amplification means 320,321, I and Q IF filter means 330,331, I and Q analogue to digital data converters 340,341, IF carrier phase signal generator 350, complex multiplication means comprising first,second,third and fourth mixers 360,361,362,363 and first and second adder/subtractors 370,371, and I and Q selectivity filters 380,381.

Such an arrangement, is suitable for operation in a very low IF mode in which the received rf signal is down-converted to a very low complex IF signal centred around a frequency of, for example and preferably, half the channel separation of adjacent channels in the radio scheme of interest (for example, in the case of GSM, the channel separation is 200 kHz and the complex IF signal is preferably centred about 100 kHz (ie the IF carrier signal has a frequency of 100 kHz)).

In such a mode, the manner of operation of the receiver of FIG. 3 would be as follows. Aerial 301 would detect an rf signal which would be amplified by means 302 and passed on to the rf down-conversion mixers 310,311. Local rf oscillator 305 generates I and Q rf signals of a predetermined frequency equal to the mid-channel frequency of the channel to be received plus the IF carrier frequency, which in this case is half the channel spacing or 100 kHz. Note at this point no filtering has been performed so the output complex signal from mixers 310,311 will include the wanted channel signal occupying between dc and the channel bandwidth plus after that all of the preceding channels (ie the preceding adjacent channel will occupy from 200 kHz to 400 kHz and the preceding alternate channel will occupy from 400 kHz to 600 kHz etc.) Additionally, there will be image channels occupying the inverted frequency ranges (i.e. the following adjacent channel will occupy from dc to −200 kHz and the following alternate channel will occupy from −200 kHz to −400 kHz). These signals are then amplified by IF amplification means 320,321 and then passed through low pass filters 330,331. Note that the low pass filters 330,331 are not complex filters and thus cannot distinguish from positive and minus complex signals whose frequencies have the same magnitude although being opposite in sign; furthermore, so as not to lose any important information contained within the wanted channel and because of the impossibility of producing infinitely sharp filters, in addition to allowing both the wanted and the following adjacent channels through completely unattenuated, the filters will also allow through a significantly large portion of the preceding adjacent channel and the following alternate channel. The filtered signals are then passed on to the non-complex AD data converters 340,341 and the outputs of these are fed to the complex multiplier arrangement 360, 361,362,363,370,371. Ordinarily, the complex multiplier arrangement would act to remove or reject the image channels and to down-convert the IF signal to baseband. This signal is then passed to the selectivity filters which remove any components whose frequency lies outside the bandwidth of the wanted signal thus removing any noise from the preceding adjacent channel admitted by the low pass filters 330,331.

However, in the complex multiplier arrangement of FIG. 3, the adder/subtractors 370,371 are programmable in the sense that they can selectively invert the signals input to them. In this way it is possible to alter the behaviour of the complex multiplier to remove the "wanted" channel and to keep the "image" channel instead without having to reprogram the local rf oscillator 305. Since it is possible for the adder/subtractors to invert or uninvert an input signal almost instantaneously, it is possible for the receiver to effectively instantaneously switch between to adjacent channels. (Note, instead of inverting the signals at the inputs of the adder/subtractors it would also be possible to alter the signals generated by the IF carrier phase signal generator 430 to achieve the same effect. Similar alternative mechanisms may occur to a person skilled in the art which achieve the same object of being effectively instantaneous as a result of being carried out in the purely digital domain of the complex multiplier arrangement).

Furthermore, by altering the complex signal produced by the IF carrier phase signal generator it is possible to shift what is left of either the preceding channel or the following alternate channel to baseband. Although no reliable data can be recovered from these channels (without reprogramming the local rf oscillator 305) it will be possible from this to obtain an estimate of the amount of power being transmitted in these channels which may be useful information in itself.

Figure 4:
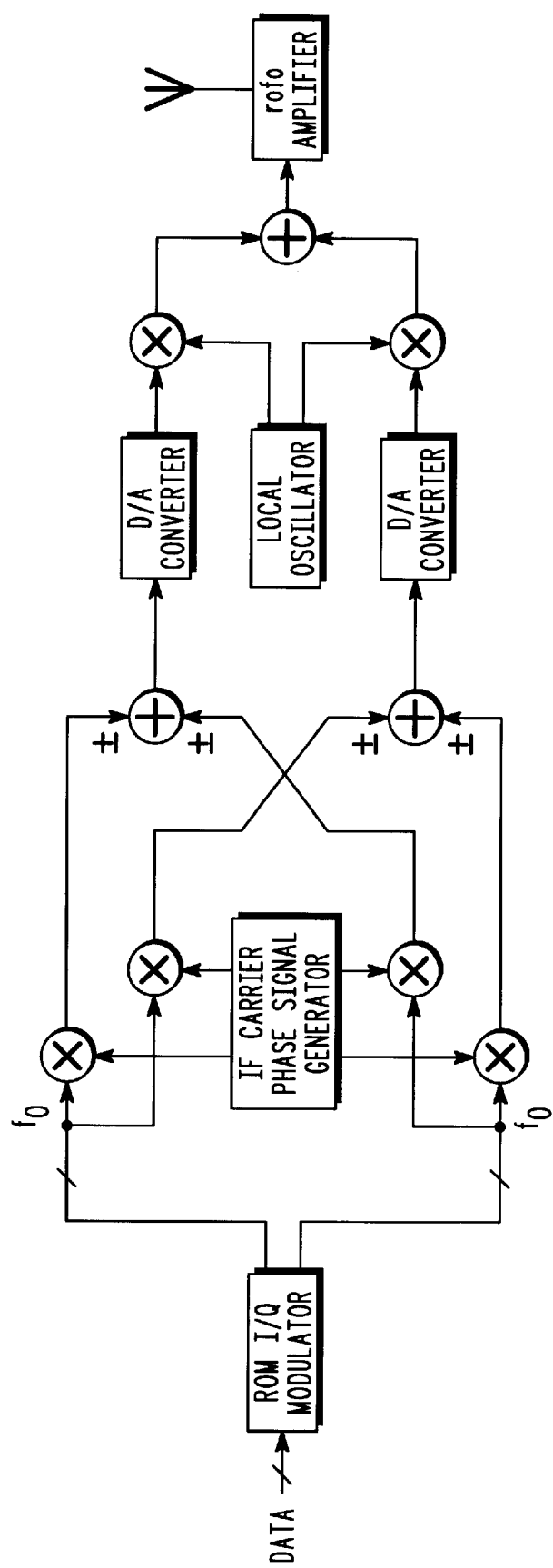
FIG. 4 is a block diagram of radio transmitter circuitry.

FIG. 4 shows a transmitter which is similar in many respects to the receiver of FIG. 3 except that transmitter type elements replace the corresponding receiver type elements of FIG. 3 and FIG. 4 further includes a ROM IQ modulator. Note that again the complex multiplier means is located in the purely digital domain and thus the (complex) frequency of the up-converted IF signal can be altered effectively instantaneously permitting the frequency of transmission of the signal to be changed almost instantaneously without requiring the frequency of operation of the local oscillator to be changed.

Although not shown in a drawing, it will by now be apparent that in a particularly preferred embodiment, there may be provided a data converter substantially as shown in either one of FIGS. 1 or 2 in which the complex multiplier forming part of the data converter includes suitable means for altering the operation of the complex multiplier means to enable effectively instantaneous alteration of which channel is received or transmitted by a receiver or transmitter incorporating such a data converter, such as by providing adder/subtractors which may selectively invert the signals input to them.

Figure 5:
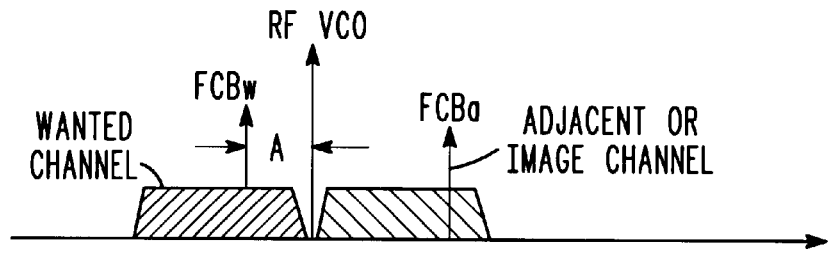
FIG. 5 is a schematic block diagram illustrating a method of detecting a Frequency Correction Burst signal.
Figure 5:
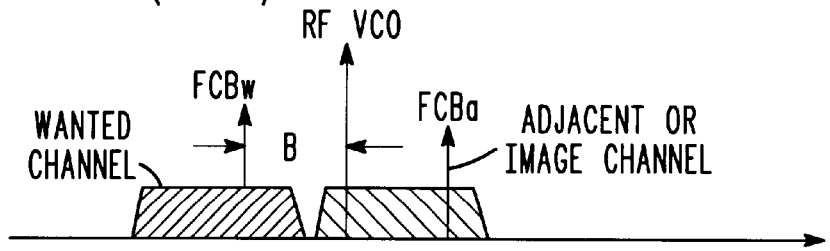
Figure 5:
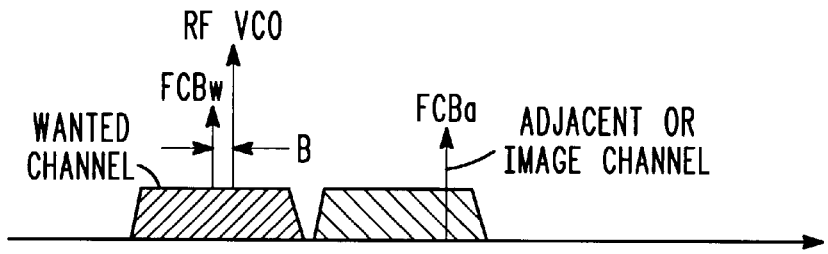

FIG. 5 illustrates a method of detecting a Frequency Correction Burst (FCB) signal which takes advantage of the complex multipliers which can alter their operation to detect either a wanted or an image channel effectively instantaneously as shown in FIGS. 3 and 4. In a perfect case in which the local oscillator generates rf/IF down-converting rf signals at exactly the correct frequency, an FCB signal transmitted at a frequency of 67.7 kHz greater than the mid-channel frequency would easily be detected by the receiver (top part of FIG. 5). If the local oscillator signal is slightly greater than desired (e.g. 54 kHz too high because of a non-perfect crystal oscillator), the FCB will still be detected at which point the frequency of the rf signal generated by the local oscillator can be successfully corrected and normal reception continued thereafter (see middle part of FIG. 5). However, where the oscillator signal is a corresponding amount less than desired (i.e. 54 kHz too low again because of a non-perfect oscillator), the FCB will not be detected because it falls within what is expected to be an image signal which is rejected by the receiver. However, because it is possible to detect the image without returning the local oscillator, the FCB can still be detected by simply altering the operation of the complex multiplier arrangement.

Figure 6:
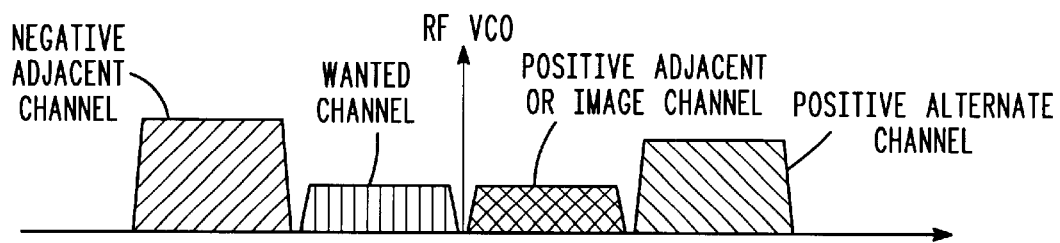
FIG. 6 is a schematic block diagram illustrating a method of measuring the power content of both adjacent channels and one alternate channel relative to a given wanted channel.
Figure 6:
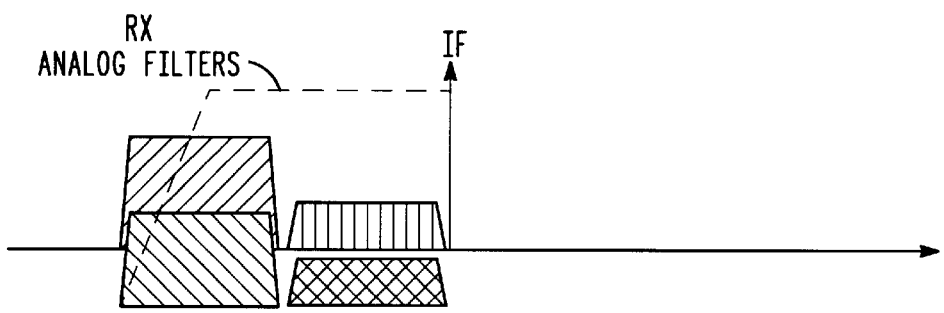
Figure 6:
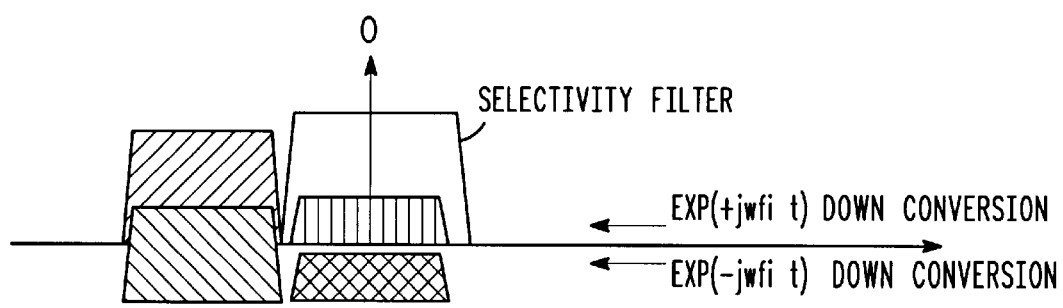
Figure 6:
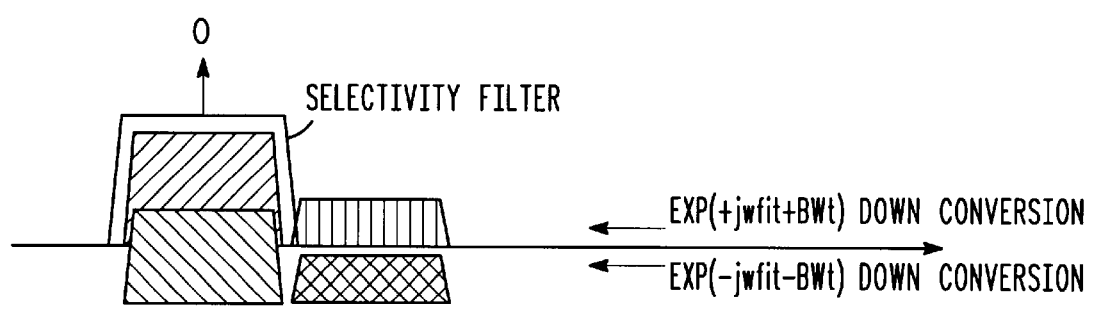

FIG. 6 illustrates how by changing the operation of the complex multiplier arrangement, it is possible to detect either a "wanted" channel or a following adjacent "image" channel, or to some extent at least, a preceding adjacent channel or following alternate image channel. The first part of FIG. 6 shows these 4 above described channels labelled as a wanted channel, positive adjacent or image channel, negative adjacent channel and positive alternate channel respectively. The second part of the Figure shows the same channels after down conversion to complex IF signals, together with the effect of the simple low pass filters labelled in FIG. 6 as the RX Analogue filters. The third and fourth parts of the Figure shows the same 4 channels after down conversion to base band depending upon the operation of the complex multiplier arrangement. Thus down-converting the IF signal by means of the complex signal $e^{i\Phi(t)}$ results in only the wanted channel being unattenuated by the selectivity filter. However, the down-converting signal $e^{-i\Phi(t)}$ would result in only the image channel being unattenuated by the selectivity filter. Similarly, the down-converting signal $e^{i(\Phi(t)+BWt)}$ where BW is the channel spacing (multiplied by $2\pi$) would result in only the negative adjacent channel being unattenuated by the selectivity filter. Finally, the down-conversion signal $e^{-i(\Phi(t)+BWt)}$ would result in only the positive alternate channel being unattenuated by the selectivity filters.

What is claimed is:

1. A complex data converter for converting between a first quadrature pair of digital signals having a first sampling rate and a quadrature pair of analogue signals, the complex data converter comprising a first conversion stage for converting between said quadrature pair of analogue signals and a first intermediate quadrature pair of digital signals having a second sampling rate which is greater than said first sampling rate; and a second conversion stage for converting between said first quadrature pair of digital signals and a second intermediate quadrature pair of digital signals having a third sampling rate which is smaller than said second sampling rate; and a processing stage for performing digital signal processing on said second intermediate quadrature pair of digital signals, wherein the processing stage includes complex multiplication means for performing a complex multiplication of two complex signals.

2. A complex data converter as claimed in claim 1 wherein the complex multiplication means is adapted to perform a phase function transformation.

3. A complex data converter as claimed in claim 1 wherein the complex multiplication means includes means for generating a transformation complex signal to be multiplied by the intermediate digital signals, wherein the complex multiplication means incorporates means for altering the transformation complex signal in a digital manner, whereby the resulting product signal is altered almost instantaneously.

4. A complex data converter as claimed in claim 1 wherein the complex multiplication means includes inversion means for selectively inverting the processed intermediate digital signals.

5. A complex data converter as claimed in claim 1 for converting said first quadrature pair of digital signals to said quadrature pair of analogue signals, and further comprising a third conversion stage for converting said second intermediate quadrature pair of digital signals after processing by said processing means and for producing said first intermediate quadrature pair of digital signals.

6. A radio apparatus comprising a complex data converter as claimed in claim 1 and further comprising frequency converter means for converting between a radio signal at radio frequency and said quadrature pair of analogue signals at an intermediate frequency, said radio signal comprising a plurality of channels spaced by a channel spacing frequency and said intermediate frequency being substantially less than said channel spacing frequency.

7. A radio apparatus comprising a complex data converter as claimed in claim 5 and further comprising frequency converter means for converting between a radio signal at radio frequency and said quadrature pair of analogue signals at an intermediate frequency, said radio signal comprising a plurality of channels spaced by a channel spacing frequency and said intermediate frequency being substantially less than said channel spacing frequency.

8. A complex data converted for converting a quadrature pair of analogue signals to a first quadrature pair of digital signals having a first sampling rate, the complex data converter comprising a first conversion stage for converting said quadrature pair of analogue signals to a first intermediate quadrature pair of digital signals having a second sampling rate which is greater than said first sampling rate; a second conversion stage for converting a second intermediate quadrature pair of digital signals to said first quadrature pair of digital signals, said second intermediate quadrature pair of digital signals having a third sampling rate which is smaller than said second sampling rate; a processing stage for performing digital signal processing on said second intermediate quadrature pair of digital signals; and a third conversion stage for converting said first intermediate quadrature pair of digital signals and producing said second intermediate quadrature pair of digital signals before processing by said processing means.

9. A radio apparatus comprising a complex data converter as claimed in claim 8 and further comprising frequency converter means for converting between a radio signal at radio frequency and said quadrature pair of analogue signals at an intermediate frequency, said radio signal comprising a plurality of channels spaced by a channel spacing frequency and said intermediate frequency being substantially less than said channel spacing frequency.

10. A complex data converter for converting a quadrature pair of analogue signals to a quadrature pair of output digital signals, the complex data converter comprising a first sigma-delta modulator stage for converting said quadrature pair of analogue signals to a first intermediate quadrature pair of digital signals having a first over-sampling rate; a decimation stage for filtering out frequency components of said first intermediate quadrature pair of digital signals and producing a second intermediate quadrature pair of digital signals at a second over-sampling rate smaller than said first over-sampling rate; a processing stage comprising multiplication means for performing a phase function transformation on said second intermediate quadrature pair of digital signals to produce a processed intermediate quadrature pair of digital signals; and output means responsive to said processed intermediate quadrature pair of digital signals for producing said quadrature pair of output digital signals, said output means comprising filter means.

11. A radio apparatus comprising a complex data converter as claimed in claim 10 and further comprising frequency converter means for converting between a radio signal at radio frequency and said quadrature pair of analogue signals at an intermediate frequency, said radio signal comprising a plurality of channels spaced by a channel spacing frequency and said intermediate frequency being substantially less than said channel spacing frequency.

12. A data converter for converting a quadrature pair of input digital signals to a quadrature pair of analogue signals, the data converter comprising a first interpolator stage for converting said quadrature pair of input digital signals to a first intermediate quadrature pair of digital signals having a first over-sampling rate; a processing stage comprising multiplication means for performing a phase function transformation on said first intermediate digital signal to produce a processed intermediate quadrature pair of digital signals; a second interpolator stage for converting said processed intermediate quadrature pair of digital signals to a second intermediate quadrature pair of digital signals having a second over-sampling rate greater than said first over-sampling rate; and output means responsive to said processed intermediate quadrature pair of digital signals for producing said quadrature pair of analogue signals, said output means comprising filter means.

13. A radio apparatus comprising a complex data converter as claimed in claim 12 and further comprising frequency converter means for converting between a radio signal at radio frequency and said quadrature pair of analogue signals at an intermediate frequency, said radio signal comprising a plurality of channels spaced by a channel spacing frequency and said intermediate frequency being substantially less than said channel spacing frequency.

* * * * *